US008907392B2

(12) United States Patent
Yamazaki et al.

(10) Patent No.: US 8,907,392 B2
(45) Date of Patent: Dec. 9, 2014

(54) SEMICONDUCTOR MEMORY DEVICE INCLUDING STACKED SUB MEMORY CELLS

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 45 days.

(21) Appl. No.: 13/718,426

(22) Filed: Dec. 18, 2012

(65) Prior Publication Data
US 2013/0161713 A1 Jun. 27, 2013

(30) Foreign Application Priority Data

Dec. 22, 2011 (JP) .................................. 2011-281599

(51) Int. Cl.
 H01L 27/108 (2006.01)
(52) U.S. Cl.
 CPC ........ H01L 27/108 (2013.01); H01L 27/10852 (2013.01); H01L 27/10873 (2013.01); H01L 27/10858 (2013.01)
 USPC ............. 257/296; 257/295; 257/43; 257/250; 257/315; 257/347; 438/241; 438/242; 438/250; 438/252; 438/254
(58) Field of Classification Search
 CPC ........ H01L 27/108; H01L 29/94; H01L 29/66
 USPC ................... 257/296, 295, 43, 250, 315, 347; 438/241–254, 296–298
 See application file for complete search history.

(56) References Cited

U.S. PATENT DOCUMENTS

| 4,555,721 A | 11/1985 | Bansal et al. |
| 5,095,347 A | 3/1992 | Kirsch |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display,"AM-FDP '09 Digest of Technical Papers, Jul. 1, 2009, pp. 227-230, The Japan Society of Applied Physics.

(Continued)

*Primary Examiner* — Lex Malsawma
*Assistant Examiner* — Sheng Zhu
(74) *Attorney, Agent, or Firm* — Fish & Richardson P.C.

(57) ABSTRACT

A semiconductor memory device which includes a memory cell including two or more sub memory cells is provided. The sub memory cells each including a word line, a bit line, a first capacitor, a second capacitor, and a transistor. In the semiconductor device, the sub memory cells are stacked in the memory cell; a first gate and a second gate are formed with a semiconductor film provided therebetween in the transistor; the first gate and the second gate are connected to the word line; one of a source and a drain of the transistor is connected to the bit line; the other of the source and the drain of the transistor is connected to the first capacitor and the second capacitor; and the first gate and the second gate of the transistor in each sub memory cell overlap with each other and are connected to each other.

16 Claims, 8 Drawing Sheets

(56) References Cited

U.S. PATENT DOCUMENTS

| | | | |
|---|---|---|---|
| 5,100,817 A | 3/1992 | Cederbaum et al. | |
| 5,341,327 A | 8/1994 | Kuriyama | |
| 5,528,032 A | 6/1996 | Uchiyama | |
| 5,567,959 A | 10/1996 | Mineji | |
| 5,610,533 A | 3/1997 | Arimoto et al. | |
| 5,731,856 A | 3/1998 | Kim et al. | |
| 5,744,864 A | 4/1998 | Cillessen et al. | |
| 5,949,092 A | 9/1999 | Kadosh et al. | |
| 6,294,274 B1 | 9/2001 | Kawazoe et al. | |
| 6,359,295 B2* | 3/2002 | Lee et al. | 257/295 |
| 6,563,174 B2 | 5/2003 | Kawasaki et al. | |
| 6,649,980 B2 | 11/2003 | Noguchi | |
| 6,707,720 B2 | 3/2004 | Kamei et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,487,373 B2 | 2/2009 | Koyama | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,781,807 B2* | 8/2010 | Nishihara et al. | 257/250 |
| 7,791,072 B2 | 9/2010 | Kumomi et al. | |
| 7,826,298 B2 | 11/2010 | Nakai et al. | |
| 7,851,279 B2 | 12/2010 | Takano et al. | |
| 7,852,655 B2 | 12/2010 | Tanaka | |
| 7,940,085 B2* | 5/2011 | Kim et al. | 326/83 |
| 8,049,253 B2 | 11/2011 | Isobe | |
| 8,072,798 B2 | 12/2011 | Takeyama | |
| 8,237,166 B2 | 8/2012 | Kumomi et al. | |
| 8,278,162 B2 | 10/2012 | Akimoto et al. | |
| 8,455,868 B2 | 6/2013 | Yamazaki et al. | |
| 8,470,688 B2 | 6/2013 | Isobe | |
| 8,704,221 B2 | 4/2014 | Yoneda et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0184350 A1* | 7/2009 | Kodama et al. | 257/296 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0075481 A1* | 3/2011 | Fukuzumi et al. | 365/185.05 |
| 2011/0089419 A1 | 4/2011 | Yamazaki et al. | |
| 2011/0156025 A1 | 6/2011 | Shionoiri et al. | |
| 2011/0182110 A1* | 7/2011 | Yamazaki et al. | 365/149 |
| 2011/0204365 A1 | 8/2011 | Saito | |
| 2012/0112191 A1 | 5/2012 | Kato et al. | |
| 2012/0161127 A1 | 6/2012 | Kato et al. | |
| 2012/0273774 A1 | 11/2012 | Noda | |
| 2012/0314482 A1 | 12/2012 | Takemura | |
| 2013/0140569 A1 | 6/2013 | Yoneda et al. | |
| 2013/0153890 A1 | 6/2013 | Yoneda | |

FOREIGN PATENT DOCUMENTS

| | | |
|---|---|---|
| JP | 60-198861 A | 10/1985 |
| JP | 63-102264 A | 5/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-246863 A | 10/1989 |
| JP | 05-251705 A | 9/1993 |
| JP | 06-013606 A | 1/1994 |
| JP | 06-275697 A | 9/1994 |
| JP | 06-291269 A | 10/1994 |
| JP | 07-094743 A | 4/1995 |
| JP | 08-148693 A | 6/1996 |
| JP | 08-264794 A | 10/1996 |
| JP | 09-245482 A | 9/1997 |
| JP | 11-505377 A | 5/1999 |
| JP | 2000-044236 A | 2/2000 |
| JP | 2000-150900 A | 5/2000 |

(56) References Cited

FOREIGN PATENT DOCUMENTS

| JP | 2002-076356 A | 3/2002 |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-042050 A | 2/2008 |
| JP | 2011-109084 A | 6/2011 |
| WO | 2004/114391 A1 | 12/2004 |

OTHER PUBLICATIONS

Orita, M et al., "Amorphous transparent conductive oxide InGaO3(ZnO)m (m>4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTS and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZNO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZNO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.

(56) References Cited

OTHER PUBLICATIONS

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MOO_3$ As A Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,$YBFE_2O_4$, and $YB_2FE_3O_7$ Types of Structures for Compounds in the $IN_2O_3$ and $SC_2O_3$—$A_2O_3$—BO Systems [A; Fe, Ga, or Al; B: Mg, Mn, Fe, Ni, Cu,or Zn] At Temperatures Over 1000°C.," Journal of Solid State Chemistry, 1985, vol. 60, pp. 382-384.

Kimizuka, N. et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—ZnO system at 1350°C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

* cited by examiner

SEMICONDUCTOR MEMORY DEVICE INCLUDING STACKED SUB MEMORY CELLS

BACKGROUND OF THE INVENTION

1. Field of the Invention

The present invention relates to a semiconductor memory device.

2. Description of the Related Art

Examples of a semiconductor memory device (also referred to as a memory device or a memory cell) include a dynamic random access memory (DRAM), which is a volatile memory. The DRAM is a semiconductor memory device which can store one-bit data using one transistor and one capacitor. An area per unit memory cell of the DRAM is small; the degree of integration thereof can be easily increased at the time of making a module; and manufacturing cost thereof is low.

When a transistor including an oxide semiconductor is used for a DRAM, charge which is held in a capacitor in the DRAM can be held for a long time owing to low off-state current characteristics of the oxide semiconductor, which enables an interval between refresh operations to be extended. As a result, it is possible to reduce power consumption (see Patent Document 1).

In addition, in order to increase the operation speed and storage capacity of a semiconductor memory device, an increase in the degree of integration by a microfabrication technology is required. However, as microfabrication of a semiconductor memory device advances, a transistor having a channel with shorter channel length and including various insulating films typified by a gate insulating layer which have smaller thickness is used for a semiconductor memory device. As a result, leakage current of the transistor is increased, so that power consumption is increased.

To reduce an area occupied by a semiconductor memory device, an area occupied by a cell can be reduced by devising a layout of a circuit (see Patent Document 2).

REFERENCE

Patent Document

[Patent Document 1] Japanese Published Patent Application No. 2011-109084
[Patent Document 2] Japanese Published Patent Application No. 2008-42050

SUMMARY OF THE INVENTION

Owing to the miniaturization of the semiconductor memory and an increase in the degree of integration thereof, the operation speed and storage capacity of the memory device can be increased. However, for example, a DRAM includes a transistor and a capacitor, and when the size of the DRAM is reduced and the degree of integration thereof is increased, the area of the capacitor is reduced, so that the capacitance of the capacitor is reduced. Therefore, difference between the amount of charge in a writing state and that in an erasing state becomes small in the memory device, which results in difficulty in accurately holding stored data.

The transistor including the oxide semiconductor enables charge which is held in a capacitor in the DRAM to be held for a long time, owing to low off-state current characteristics of the transistor, and thus power consumption can be reduced. However, the on-state current of the transistor is smaller than that of a transistor including single crystal silicon or polycrystalline silicon. Therefore, the on-state current characteristics of the transistor including an oxide semiconductor are disadvantageous in terms of operation speed in the memory device.

Thus, an object of one embodiment of the present invention is to provide a semiconductor memory device which operates at high speed and consumes low power.

Another object of one embodiment of the present invention is to provide a semiconductor memory device whose storage capacity per unit area is increased.

Another object of one embodiment of the present invention is to increase the capacitance of the capacitor in a semiconductor memory device.

One embodiment of the present invention is a semiconductor memory device which includes a memory cell including a two or more sub memory cells. The sub memory cells each including a word line, a bit line, a first capacitor, a second capacitor, and a transistor. In the semiconductor memory device, the sub memory cells are stacked in the memory cell; a first gate and a second gate are formed with a semiconductor film provided therebetween in the transistor; the first gate and the second gate are electrically connected to the word line; one of a source and a drain of the transistor is electrically connected to the bit line; the other of the source and the drain of the transistor is electrically connected to the first capacitor and the second capacitor; and the first gate and the second gate of the transistor overlap with each other and are electrically connected to each other.

In one embodiment of the present invention, the first capacitor and the second capacitor may be formed to overlap with each other in each of the sub memory cells.

In one embodiment of the present invention, the memory cells may be formed in matrix in a plane.

In one embodiment of the present invention, the transistor includes an oxide semiconductor.

According to one embodiment of the present invention, the sub memory cells overlap with each other to be stacked, whereby the memory cell can be formed. This is because an oxide semiconductor is used for an active layer of the transistor in the sub memory cell and the oxide semiconductor can be formed by a deposition method such as a sputtering method. The memory cell having a small area can be manufactured using the sub memory cells which overlap with each other to be stacked; accordingly, the storage capacity of a memory module per unit area can be further increased.

In one embodiment of the present invention can include a transistor including silicon which is stacked together with sub memory cells. The transistor including silicon is preferably provided in the lowest layer of the stacked-layer semiconductor memory device, and can be formed using a silicon substrate, for example. In addition, the number of layers including the transistor including silicon is not limited to one and may be plural so that the layers may be each provided between sub memory cells.

One embodiment of the present invention is a semiconductor memory device in which a sub memory cell is a DRAM.

According to one embodiment of the present invention, with the use of a transistor including an oxide semiconductor and having high on-state characteristics and low off-state current characteristics, it is possible to provide a semiconductor memory device which operates at high speed and consumes low power.

According to one embodiment of the present invention, a plurality of layers of the sub memory cells overlap with each other to be stacked, whereby it is possible to provide a semiconductor memory device whose memory capacity per unit area is increased.

According to one embodiment of the present invention, it is possible to increase the capacitance of a capacitor in a semiconductor memory device.

DETAILED DESCRIPTION OF THE INVENTION

Figure 1A:
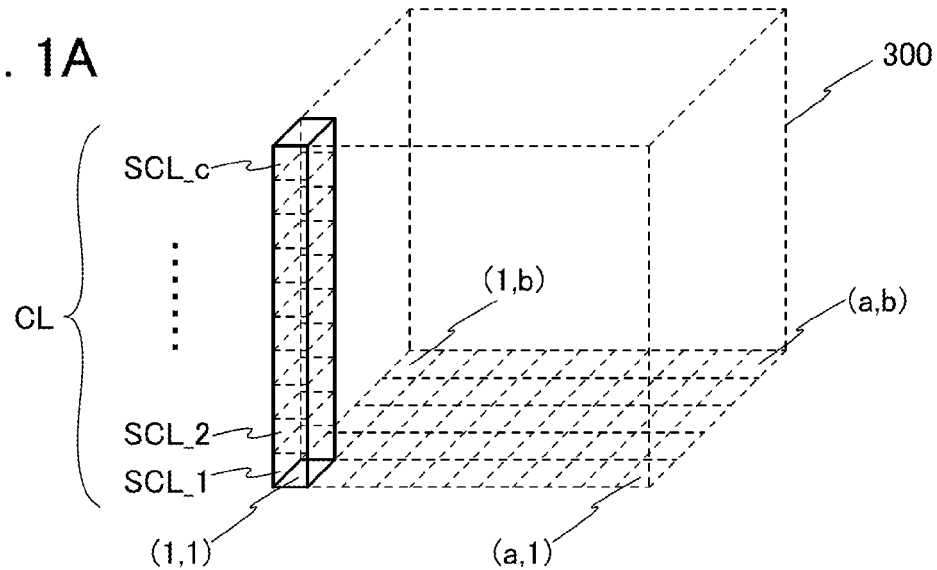
FIGS. 1A and 1B are a perspective view and a circuit diagram illustrating one example of a semiconductor memory device according to one embodiment of the present invention.

Embodiments of the present invention will be described below with reference to the accompanying drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In addition, in this specification, when one of a source and a drain of a transistor is called a drain, the other is called a source. That is, they are not distinguished depending on the potential level. Therefore, a portion called a source in this specification can be alternatively referred to as a drain.

In this specification, a gate of a transistor is referred to as a "gate" or a "gate electrode", and these terms are not distinguished from each other. In addition, a source and a drain of a transistor are referred to as a "source" and a "drain", a "source region" and a "drain region", or a "source electrode" and a "drain electrode", respectively, and these terms are not distinguished from each other.

Further, even when the expression "to be connected" is used in this specification, there is a case in which no physical connection is made and a wiring is just extended in an actual circuit. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

(Embodiment 1)

In this embodiment, an example of a structure of a memory cell which is a semiconductor memory device and its operation example will be described with reference to FIGS. 1A and 1B, FIGS. 2A and 2B, and the like.

In a semiconductor memory device 300 illustrated in FIG. 1A, which is one embodiment of the present invention, a memory cell CL is formed with a stack of sub memory cells SCL each including a transistor, a first capacitor (also referred to as a front capacitor (Cf)), and a second capacitor (also referred to as a back capacitor (Cb)). The memory cells CL are arranged in matrix of a (in the horizontal direction)×b (in the vertical direction) in a plane (a and b are natural numbers).

The sub memory cell SCL is a memory device including a transistor, a front capacitor, and a back capacitor; that is, a DRAM is formed therein.

The memory cell CL includes c sub memory cells SCL_1 to SCL_c (c is a natural number) which are stacked. The sub memory cell SCL_j (j is a natural number from 1 to c) includes a transistor Tr_j (j is a natural number from 1 to c), a front capacitor Cf_j (j is a natural number from 1 to c), and a back capacitor Cb_j (j is a natural number from 1 to c). The transistor Tr_j is what is called a dual-gate transistor which is controlled by a gate of the transistor Tr_j (also referred to as a first gate or a front gate) and a gate of a transistor Tr_(j−1) (also referred to as a second gate or a back gate) which overlaps with the gate of the transistor Tr_j with a semiconductor film positioned therebetween. Note that in the case of a transistor Tr_1, a back gate thereof is not a gate of the transistor Tr_(j−1) but a wiring which overlaps with a gate of the transistor Tr_1 with a semiconductor film of the transistor Tr_1 positioned therebetween. Note that the front gate and the back gate of the transistor in each sub memory cell are electrically connected to each other.

The front capacitor Cf_j is formed using a capacitance of a gate insulating film between a capacitor electrode which is formed using the same material and same layer as those of the front gate and one of a source and a drain of the transistor Tr_j. The back capacitor Cb_j is formed using a capacitance of an insulating film between a capacitor electrode of a front capacitor Cf_(j−1) and the one of the source and the drain of the transistor Tr_j.

Note that a back capacitor Cb_1 may be formed using a capacitance of an insulating film between one of a source and a drain of the transistor Tr_1 and a capacitor wiring which is separately provided below a sub memory cell SCL_1.

Figure 1B:
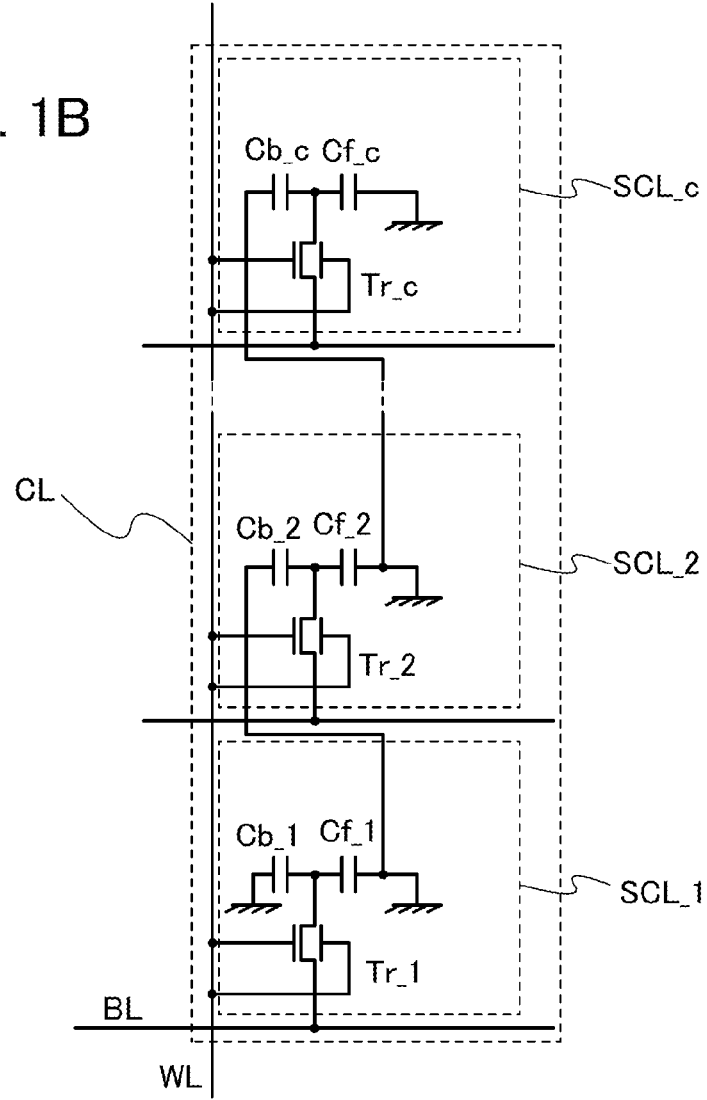

A circuit connection of the memory cell CL including the sub memory cells SCL_1 to SCL_c is as follows as illustrated in FIG. 1B: for example, in the case of the sub memory cell SCL_1, a front gate and the back gate of the transistor Tr_1 are connected to a word line WL, one of the source and the drain of the transistor Tr_1 is connected to a bit line BL_1, the other of the source and the drain of the transistor Tr_1 is connected to one end of a front capacitor Cf_1 and one end of the back capacitor Cb_1, and the other end of the front capacitor Cf_1 and the other end of the back capacitor Cb_1 are grounded (connected to GND). In addition, the other end of the front capacitor Cf_1 is connected to the other end of a back capacitor Cb_2 in a sub memory cell SCL_2.

The gates of the transistors in the sub memory cells which are stacked are connected to the word line. Therefore, when a signal is input to the word line, the transistors in the stacked sub memory cells can be operated at the same time.

As illustrated in FIG. 1B, the other end of the back capacitor Cb_j is grounded in the case where j is 1, and is connected to the other end of a front capacitor Cf_(j−1) in the case where j is greater than 1.

As the transistor Tr_j, a transistor with small off-state current is used. For example, with the use of a wide-gap semiconductor having a band gap of 2.5 eV or higher, a transistor with small off-current can be formed. In particular, an oxide semiconductor is preferably used.

When the transistor with small off-state current is used in the sub memory cell, charges held in the front capacitor and the back capacitor can be prevented from leaking through the transistor Tr_j. Accordingly, a holding time of a potential can be prolonged and therefore the frequency of refresh in the DRAM can be reduced, so that the power consumption can be reduced.

The transistor Tr_j described in this embodiment is what is called a dual-gate transistor having a front gate and a back gate. Thus, when a voltage which is higher than the threshold voltage is applied to the front gate of the transistor, the transistor is turned on. In addition, since the same voltage is applied to the back gate at this time, the threshold voltage is shifted negatively. Accordingly, on-state current in the case where a gate voltage is higher than a certain threshold voltage is larger than on-state current of a transistor having no back gate. In addition, when a voltage which is lower than the threshold voltage is applied to the front gate of the transistor, the transistor is turned off. In addition, since the same voltage is applied to the back gate at this time, the threshold voltage is shifted positively. Accordingly, off-state current in the case where a gate voltage is lower than a certain threshold voltage is smaller than off-state current of a transistor having no back gate.

In other words, since the semiconductor memory device described in this embodiment is formed so that both high on-state current and low off-state current are obtained by using the transistor including the oxide semiconductor, the semiconductor memory device can operate at high speed and consume low power.

Furthermore, by adjusting the capacitance of the capacitor in each sub memory cell, a plurality of potential levels can be set. Thus, a multi-valued memory cell can be manufactured.

Next, methods for writing and reading data to/from the memory cell are described below.

Writing of data to the memory cell can be performed in each sub memory cell. Specifically, the potential of the word line is set to VH (a potential which is higher than the sum of the threshold voltage (Vth) of the transistor and VDD (power supply potential)). Next, a potential of a bit line which is selected arbitrarily is set to VDD, and the other bit lines are set to GND. As a result, VDD is charged in a capacitor in a sub memory cell which is connected to the selected bit line. Then, the potential of the word line is set to GND, whereby data is held in the sub memory cell. After that, data is sequentially written to other sub memory cells. This is the method for writing data to the memory cell.

Low off-state current of the transistor using an oxide semiconductor film, which is one embodiment of the present invention, enables data written to the memory cell array in this manner to be stored for a long time.

Then, a method for reading data is described. Data reading is performed in each sub memory cell. First, a potential of a bit line which is selected arbitrarily is set to a predetermined potential (fixed potential). Next, the potential of the word line is set to VH, whereby a potential corresponding to data written to the capacitor is applied to the bit line. After that, the applied potential is read by a sense amplifier (not illustrated in particular). Note that data is lost at the same time as the data reading; however the data can be amplified by operation of the sense amplifier and then can be rewritten in the sub memory cell. After that, data is sequentially read from other sub memory cells. This is the method for reading data from the memory cell.

The methods for writing and reading data to/from the memory cell are not limited to the methods in which writing and reading are performed on each sub memory cell. Alternatively, writing and reading may be performed on all the sub memory cells at a time.

Figure 2A:
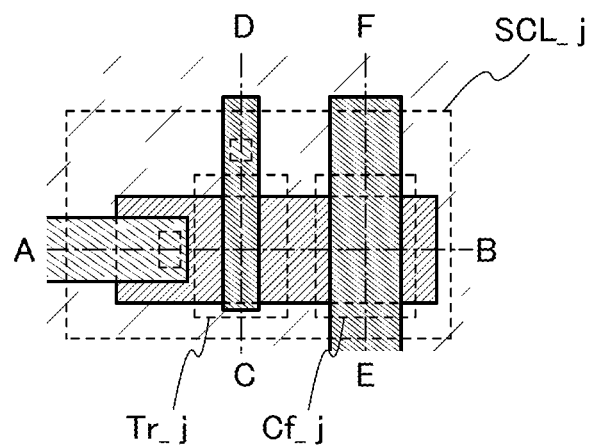
FIGS. 2A and 2B are a top view and a cross-sectional view illustrating one example of a memory cell in a semiconductor memory device according to one embodiment of the present invention.
Figure 2B:
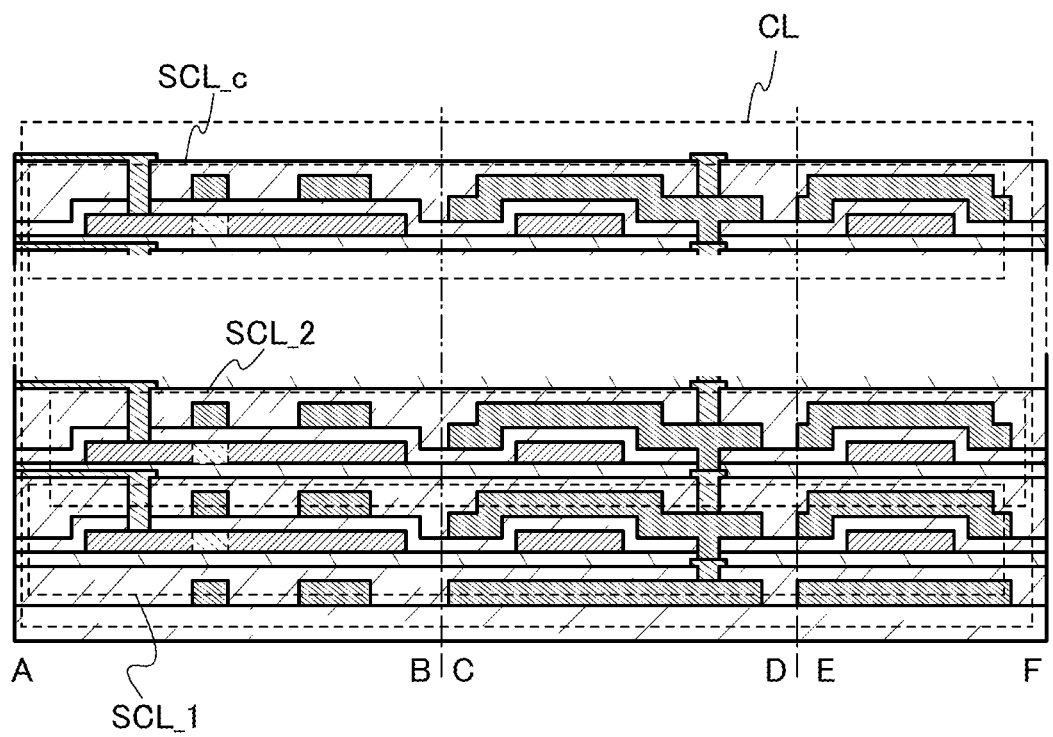

Next, a cross-sectional structure of the memory cell CL, in which the sub memory cells SCL overlap with each other to be stacked as illustrated in FIGS. 1A and 1B, is described using FIGS. 2A and 2B. The memory cell CL illustrated in FIGS. 2A and 2B includes the c sub memory cells SCL_1 to SCL_c which overlap with each other. Each sub memory cell includes the transistor Tr_j (j is a natural number from 1 to c), the front capacitor Cf_j (j is a natural number from 1 to c), and the back capacitor Cb_j (j is a natural number from 1 to c). FIG. 2A is a top view of the sub memory cell SCL_j and FIG. 2B is a cross-sectional view of the sub memory cells SCL_1 to SCL_c.

In the top view of FIG. 2A, the transistor Tr_j and the front capacitor Cf_j provided in the sub memory cell SCL_j are illustrated. Note that the back capacitor Cb_j is not illustrated to avoid complexity. Cross sections A-B, C-D, and E-F taken along dashed dotted lines A-B, C-D, and E-F, respectively, in the top view of the sub memory cell SCL_j in FIG. 2A are illustrated in FIG. 2B.

As illustrated in FIG. 2B, the sub memory cells overlap with each other to be stacked, and films in the transistors and the capacitors included in the sub memory cells also overlap with each other. All of the front gates (including the back gates) of the transistors in the sub memory cells are electrically connected to each other.

Figure 3A:
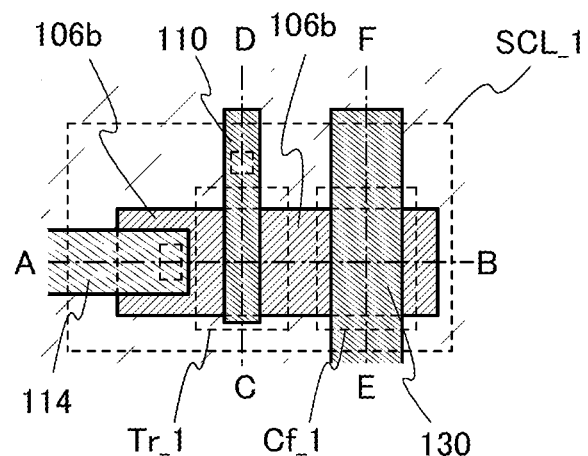
FIGS. 3A and 3B are a top view and a cross-sectional view illustrating the one example of a sub memory cell in the semiconductor memory device according to one embodiment of the present invention.
Figure 3B:
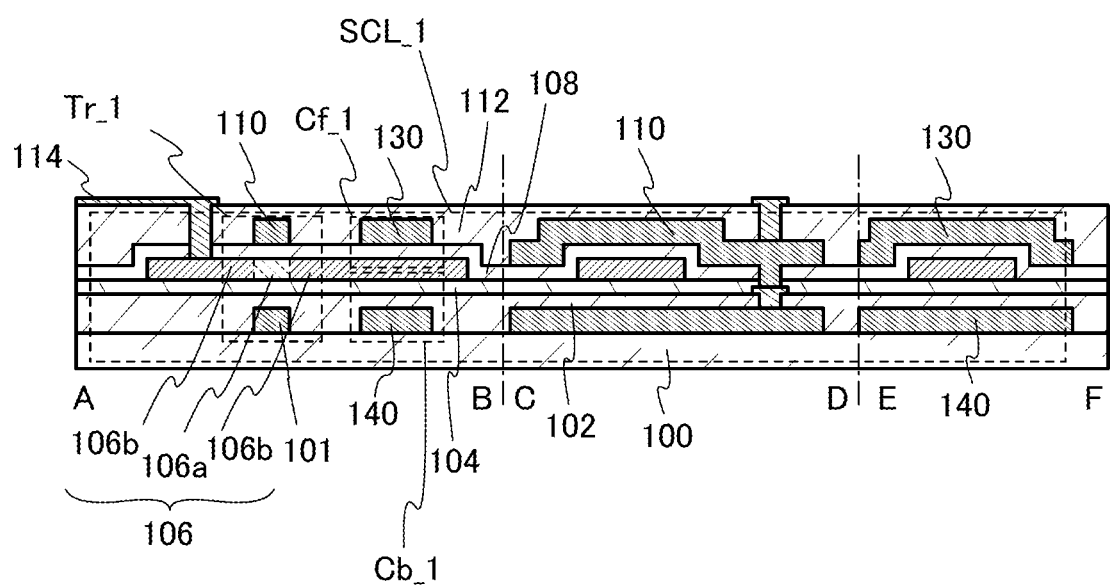

Next, a cross sectional structure of the transistor Tr_1, the front capacitor Cf_1, and the back capacitor Cb_1 in the sub memory cell SCL_1 is described in detail using FIGS. 3A and 3B.

FIG. 3A is a top view of the transistor Tr_1 and the front capacitor Cf_1 in the sub memory cell SCL_1. Note that the back capacitor Cb_1 is not illustrated to avoid complexity. Cross sections A-B, C-D, and E-F taken along dashed dotted lines A-B, C-D, and E-F, respectively, in the top view of the sub memory cell SCL_1 in FIG. 3A are illustrated in FIG. 3B.

The transistor Tr_1 illustrated in FIG. 3B includes a substrate 100, a first wiring 101 and a third wiring 140 which are provided over the substrate 100, a first interlayer insulating film 102 which is provided over the first wiring 101 and the third wiring 140, a base insulating film 104 which is provided over the first interlayer insulating film 102, an oxide semiconductor film 106 which is provided over the base insulating film 104 and includes a channel formation region 106a and source and drain regions 106b, a gate insulating film 108 over the oxide semiconductor film 106, a gate electrode 110 and a capacitor electrode 130 over the gate insulating film 108, a second interlayer insulating film 112 over the gate electrode 110 and the capacitor electrode 130, and a second wiring 114 which is connected to the source or drain regions 106b in a contact hole which is provided in the second interlayer insulating film 112.

The capacitor electrode 130 in the capacitor Cf_1 can be formed using the same material and the same layer as those of the gate electrode 110.

The third wiring 140 in the capacitor Cb_1 can be formed using the same material and the same layer as those of the first wiring 101.

The first wiring 101 functions as the back gate of the transistor Tr_1.

Note that a structure may be employed in which the base insulating film 104 is not particularly provided and the first interlayer insulating film 102 also has a function as the base insulating film 104.

The contact hole is not limited to the one described in this embodiment. For example, the contact hole may be formed at a time so as to penetrate a plurality of layers. Alternatively, the contact hole may be formed separately in individual layers by plural steps.

The oxide semiconductor film 106 in this embodiment includes the channel formation region 106a and the source and drain regions 106b which have lower resistance than the channel formation region 106a. Contact resistance to the second wiring 114 can be reduced by providing the source and drain regions 106b as described above, so that the on-state characteristics of the transistor can be improved. Note that the oxide semiconductor film 106 is not limited to the one including the source and drain regions 106b as described above, and the oxide semiconductor film may have no low resistance region.

The source and drain regions 106b contain one or more kinds of elements selected from phosphorus, boron, nitrogen, and fluorine. When one or more of the above elements are added to the oxide semiconductor film, the resistance value of the oxide semiconductor film can be reduced.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of GaN or the like; a silicon-on-insulator (SOI) substrate; or the like may be used as the substrate 100. Still alternatively, any of these substrates further provided with a semiconductor element is preferably used as the substrate 100.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

As the substrate 100, a substrate which has been subjected to heat treatment may be used. For example, the heat treatment performed on the substrate may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

The first wiring 101 and the third wiring 140 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the first wiring 101. Further, the first wiring 101 and the third wiring 140 may have a single-layer structure or a stacked-layer structure.

The first wiring 101 and the third wiring 140 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

The first interlayer insulating film 102 and the base insulating film 104 may be formed to have a single-layer structure or a stacked-layer structure including one or more of silicon oxide, silicon oxynitride, silicon nitride oxide, silicon nitride, aluminum oxide, aluminum nitride, hafnium oxide, zirconium oxide, yttrium oxide, gallium oxide, lanthanum oxide, cesium oxide, tantalum oxide, and magnesium oxide.

Heat treatment is preferably performed after the formation of the base insulating film 104 to remove impurities such as hydrogen and moisture which are contained in the first interlayer insulating film 102 or the base insulating film 104. The heat treatment is performed at a temperature higher than or equal to 350° C. and lower than the strain point of the substrate, preferably higher than or equal to 450° C. and lower than or equal to 650° C. An atmosphere of the heat treatment may be an inert atmosphere, an oxidizing atmosphere, or the like.

Further, it is preferable that the first interlayer insulating film 102 and the base insulating film 104 have sufficient planarity. Specifically, the films serving as a base are provided so as to have an average surface roughness (Ra) of 1 nm or less, preferably 0.3 nm or less, further preferably 0.1 nm or less. When Ra is less than or equal to the above value, a crystal region is easily formed in the oxide semiconductor film. Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a designated surface" and is defined by Formula 1.

$$Ra = \frac{1}{S_0} \int_{y1}^{y2} \int_{x1}^{x2} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the average height of the specific surface. Ra can be measured using an atomic force microscope (AFM).

In this specification, silicon oxynitride refers to a substance that contains a larger amount of oxygen than that of nitrogen. For example, silicon oxynitride contains oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. In addition, silicon nitride oxide refers to a substance that contains a larger amount of nitrogen than that of oxygen. For example, silicon nitride oxide contains oxygen, nitrogen, silicon, and hydrogen at concentrations higher than or equal to 5 at. % and lower than or equal to 30 a. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that the above ranges are ranges for cases where measurement is performed using Rutherford backscattering spectrometry (RBS) and hydrogen forward scattering spectrometry (HFS). Moreover, the total of the percentages of the constituent elements does not exceed 100 at. %.

It is preferable that an insulating film which releases oxygen by heat treatment is used as the first interlayer insulating film 102 and the base insulating film 104.

To release oxygen by heat treatment means that the released amount of oxygen which is converted into oxygen atoms is greater than or equal to $1.0 \times 10^{18}$ atoms/cm$^3$, preferably greater than or equal to $3.0 \times 10^{20}$ atoms/cm$^3$ in a thermal desorption spectroscopy (TDS) analysis.

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to a numerical Formula 2 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2} = \frac{N_{H2}}{S_{H2}} \times S_{O2} \times \alpha \quad \text{[Formula 2]}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Formula 2. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ is determined considering the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the transistor including an oxide semiconductor film, oxygen is supplied from the base insulating film to the oxide semiconductor film, whereby an interface state density between the oxide semiconductor film and the base insulating film can be reduced. As a result, carrier trapping at the interface between the oxide semiconductor film and the base insulating film due to the operation of a transistor or the like can be suppressed, and thus, the transistor can have high reliability.

Further, in some cases, charge is generated due to oxygen vacancies in the oxide semiconductor film. In general, part of oxygen vacancies in an oxide semiconductor film serves as a donor and causes release of an electron which is a carrier. As a result, the threshold voltage of a transistor shifts in the negative direction. When oxygen is sufficiently supplied from the base insulating film to the oxide semiconductor film and the oxide semiconductor film preferably contains excessive oxygen, the density of oxygen vacancies in the oxide semiconductor film, which causes the negative shift of the threshold voltage, can be reduced.

A material used for the oxide semiconductor film 106 preferably contains at least indium (In) or zinc (Zn). In particular, In and Zn are preferably contained. As a stabilizer for reducing variation in electrical characteristics of a transistor including the oxide semiconductor film 106, gallium (Ga) is preferably additionally contained. Tin (Sn), hafnium (Hf), aluminum (Al), titanium (Ti), or zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film when the CAAC-OS film is formed. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In addition, in an oxide semiconductor having a crystal part, such as the CAAC-OS, defect in the bulk can be further reduced. In addition, the oxide semiconductor can have higher mobility than an amorphous oxide semiconductor by improvement in surface planarity. To improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

The oxide semiconductor film can be formed by sputtering, a molecular beam epitaxy (MBE) method, a CVD method, a pulse laser deposition method, an atomic layer deposition (ALD) method, or the like as appropriate. In addition, the oxide semiconductor film may be deposited using a sputtering apparatus in which deposition is performed in a state where surfaces of a plurality of substrates are set substantially perpendicularly to a surface of a sputtering target.

It is preferable that the oxide semiconductor film is highly purified and hardly contains impurities such as copper, aluminum, and chlorine. In the process for manufacturing the transistor, steps in which these impurities are not mixed or attached to the surface of the oxide semiconductor film are preferably selected as appropriate. In the case where the impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment). Specifically, the copper concentration in the oxide semiconductor film is lower than or equal to $1 \times 10^{18}$ atoms/cm$^3$, preferably lower than or equal to $1 \times 10^{17}$ atoms/cm$^3$. The aluminum concentration in the oxide semiconductor film is lower than or equal to $1 \times 10^{18}$ atoms/cm$^3$. Further, the concentration of chlorine in the oxide semiconductor film is lower than or equal to $2 \times 10^{18}$ atoms/cm$^3$.

The gate insulating film 108 can be formed by a plasma CVD method, a sputtering method, or the like. The gate insulating film 108 may be formed of a single layer or a stack of layers using one or more kinds of materials selected from silicon oxide, silicon oxynitride, aluminum oxide, aluminum oxynitride, hafnium oxide, gallium oxide, magnesium oxide, tantalum oxide, yttrium oxide, zirconium oxide, lanthanum oxide, and neodymium oxide.

The gate insulating film 108 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. The use of the gate insulating film 108 for the capacitor is preferable because it makes it possible to increase the capacitance of the capacitor. Further, the gate insulating film 108 may have a single-layer structure or a stacked-layer structure.

The gate electrode 110 and the capacitor electrode 130 can be formed using a metal material such as molybdenum, titanium, tantalum, tungsten, aluminum, copper, chromium, neodymium, or scandium, or an alloy material which includes any of these materials as a main component. Alternatively, a semiconductor film typified by a polycrystalline silicon film doped with an impurity element such as phosphorus, or a silicide film such as a nickel silicide film may be used as the gate electrode 110. The gate electrode 110 may be formed with either a single-layer structure or a stacked-layer structure.

The gate electrode 110 and the capacitor electrode 130 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

As one layer of the gate electrode 110 which is in contact with the gate insulating film 108, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher, preferably 5.5 eV or higher, which enables the threshold voltage, which is one of electric characteristics of a transistor, to be positive when used as the gate electrode layer.

The second interlayer insulating film 112 is formed using the same material as that of the base insulating film 104.

It is preferable that the second interlayer insulating film 112 has low relative permittivity and a sufficient thickness. For example, a silicon oxide film having a relative permittivity of approximately 3.8 and a thickness of greater than or equal to 300 nm and less than or equal to 1000 nm may be used. A surface of the interlayer insulating film 112 has a little fixed charge because of influence of atmospheric components and the like, which might cause the shift of the threshold voltage of the transistor. Therefore, it is preferable that the interlayer insulating film 112 has relative permittivity and a thickness such that the influence of the electric charge at the surface is sufficiently reduced.

A metal film containing an element selected from aluminum (Al), chromium (Cr), copper (Cu), tantalum (Ta), titanium (Ti), molybdenum (Mo), and tungsten (W), a metal nitride film containing any of the above elements as its component (e.g., a titanium nitride film, a molybdenum nitride film, or a tungsten nitride film), or the like can be used to form the second wiring 114. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the second wiring 114 may be formed using a conductive metal oxide. As the electrically conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

(Method for Manufacturing Transistor)

Next, a method for manufacturing the transistor Tr_1, the front capacitor Cf_1, and the back capacitor Cb_1 in the cross section taken along the line A-B in the sub memory cell SCL_1, which is illustrated in FIG. 3B, is described using FIGS. 4A to 4C and FIGS. 5A to 5C.

Figure 4A:
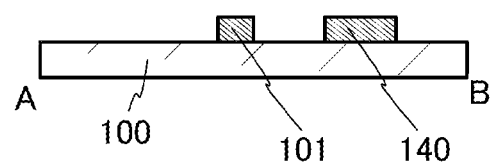
FIGS. 4A to 4C are cross-sectional views illustrating one example of a manufacturing process of the memory cell according to one embodiment of the present invention.

First, the first wiring 101 and the third wiring 140 are formed over the substrate 100 (see FIG. 4A). The first wiring 101 and the third wiring 140 are formed in such a manner that a conductive film is deposited over the substrate 100 and is processed. Note that an insulating film may be additionally provided between the substrate 100 and each of the first wiring 101 and the third wiring 140 depending on a material of the substrate 100. For example, a silicon nitride film or the like which has a blocking property may be formed to prevent diffusion of impurities from the substrate.

Note that "to process" means performing etching using a resist mask formed by a photolithography method to obtain a film having a desired shape, unless otherwise specified.

Note that the etching of the conductive film may be performed by dry etching, wet etching, or both of them.

Figure 4B:
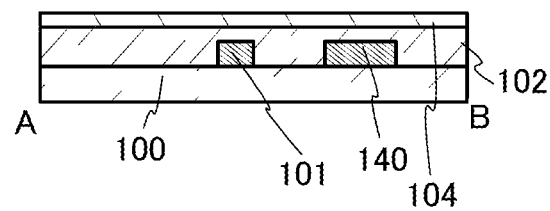

Next, the first interlayer insulating film 102 and the base insulating film 104 are formed over the substrate 100, the first wiring 101, and the third wiring 140 (see FIG. 4B). The first interlayer insulating film 102 and the base insulating film 104 can be formed by a chemical vapor deposition (CVD) method, a sputtering method, a molecular beam epitaxy (MBE) method, or a pulsed laser deposition (PLD) method and are preferably formed by a sputtering method.

After the first interlayer insulating film 102 is formed over the substrate 100, the first wiring 101, and the third wiring 140, a surface of the first interlayer insulating film 102 is preferably subjected to planarization treatment. As the planarization treatment, chemical mechanical polishing (CMP) treatment or the like may be employed, for example. After the surface of the first interlayer insulating film 102 is planarized, the base insulating film 104 is formed. Such planarization of the surface of the first interlayer insulating film 102 prevents a breakage of a film to be formed in a later step, which can lead to an improvement in accuracy of light exposure by a photolithography method. Note that planarization treatment may be performed in each of the timing after the formation of the first interlayer insulating film 102 and the timing after the formation of the base insulating film 104, or may be performed only after the formation of the base insulating film 104.

Although there is no particular limitation on the planarization treatment, CMP treatment, dry-etching treatment, plasma treatment, or the like can be used as the planarization treatment.

To remove impurities such as hydrogen and moisture contained in the first interlayer insulating film 102 or the base insulating film 104, heat treatment is preferably performed after the deposition of the first interlayer insulating film 102 or the base insulating film 104. The heat treatment is performed at a temperature higher than or equal to 350° C. and lower than the strain point of the substrate, preferably higher than or equal to 450° C. and lower than or equal to 650° C. The heat treatment may be performed at an inert atmosphere or an oxidizing atmosphere.

Next, an oxide semiconductor film is deposited over the base insulating film 104. The oxide semiconductor film may be deposited by a CVD method, a sputtering method, an MBE method, or a PLD method and is preferably formed by a sputtering method.

In the deposition of the oxide semiconductor film, in order that hydrogen and moisture are contained in the oxide semiconductor film as little as possible, it is preferable that the substrate is preheated in a treatment chamber of a sputtering apparatus as pretreatment of the deposition of the oxide semiconductor film so that impurities such as hydrogen and moisture adsorbed on the substrate 100 and the base insulating film 104 are detached.

Further, before the oxide semiconductor film is deposited, planarization treatment may be performed on a surface of the base insulating film 104.

As the plasma treatment, reverse sputtering can be performed. The reverse sputtering is a method in which voltage is applied to a substrate side with use of an RF power source, for example, in an argon atmosphere, and plasma is generated in the vicinity of the substrate so that a surface to be processed is modified. Note that instead of an argon atmosphere, a nitrogen atmosphere, a helium atmosphere, an oxygen atmosphere, or the like may be used.

Note that the oxide semiconductor film is preferably formed in conditions such that a large amount of oxygen is contained in the oxide semiconductor film at the time of the deposition (e.g., the deposition is performed in an atmosphere containing oxygen at 100% by a sputtering method).

After formation of the oxide semiconductor film, heat treatment may be performed. By the heat treatment, the degree of crystallinity of the oxide semiconductor film is increased. In addition, the concentration of impurities (such as hydrogen and moisture) in the oxide semiconductor film can be reduced, so that the defect level in the oxide semiconductor film can be reduced.

The heat treatment may be performed in an atmosphere selected from an oxidizing atmosphere, an inert atmosphere, a reduced-pressure atmosphere, and a dry-air atmosphere or in a combined atmosphere of two or more of the aforementioned atmospheres. Preferably, heat treatment is performed in an inert atmosphere and then heat treatment is further performed in an oxidizing atmosphere. The heat treatment may be performed at a temperature higher than or equal to 150° C. and lower than or equal to 650° C., preferably higher than or equal to 250° C. and lower than or equal to 500° C., and further preferably higher than or equal to 300° C. and lower than or equal to 450° C. A resistance heating method, a lamp heating method, a method using a heated gas, or the like may be used in the heat treatment.

Note that an oxidizing atmosphere refers to an atmosphere containing an oxidizing gas. Oxidizing gas is oxygen, ozone, nitrous oxide, or the like, and it is preferable that the oxidizing gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). The oxidizing atmosphere may contain a mixed gas of an oxidizing gas and an inert gas. In that case, the atmosphere contains an oxidizing gas at a concentration of at least higher than or equal to 10 ppm. By performing heat treatment in the oxidizing atmosphere, the density of oxygen vacancies in the oxide semiconductor film can be reduced.

The inert atmosphere contains an inert gas such as nitrogen or a rare gas as its main component. Specifically, in an inert atmosphere, the concentration of a reactive gas such as an oxidizing gas is lower than 10 ppm. By performing heat treatment in an inert atmosphere, the concentration of impurities included in the oxide semiconductor film can be reduced.

In a reduced-pressure atmosphere, a pressure of a treatment chamber is lower than or equal to 10 Pa. By performing heat treatment in a reduced-pressure atmosphere, the concentration of impurities included in the oxide semiconductor film can be reduced as compared to the case of employing the inert atmosphere.

The dry-air atmosphere refers to an atmosphere with a dew point of lower than or equal to −40° C., preferably lower than or equal to −50° C. and with an oxygen content of approximately 20% and a nitrogen content of approximately 80%. The dry-air atmosphere is a kind of the oxidizing atmosphere. Since the dry-air atmosphere is relatively low in cost, it is suitable for mass production.

Figure 4C:
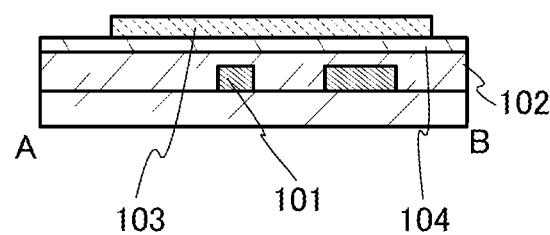
Figure 5A:
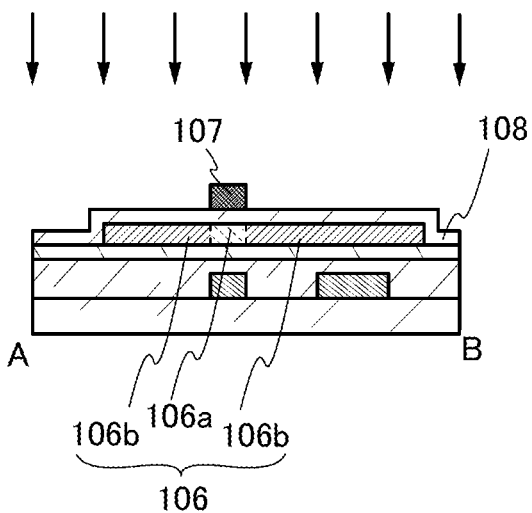
FIGS. 5A to 5C are cross-sectional views illustrating the one example of the manufacturing process of the memory cell according to one embodiment of the present invention.
Figure 5B:
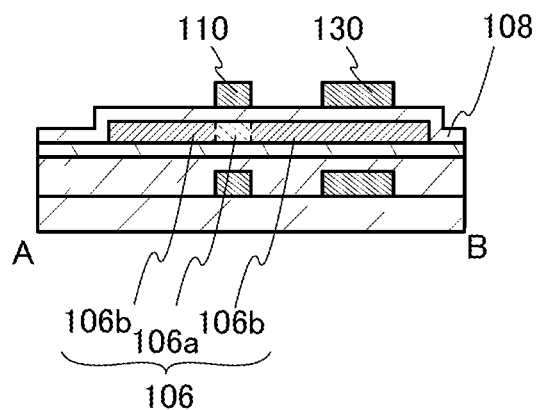
Figure 5C:
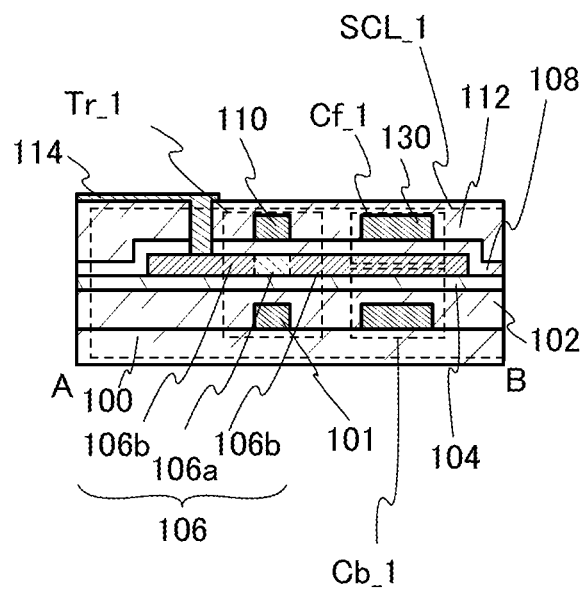

Next, the oxide semiconductor film is processed to form the oxide semiconductor film 103 (see FIG. 4C).

Note that the etching of the oxide semiconductor film may be dry etching, wet etching, or both dry etching and wet etching. As an etchant used for wet etching of the oxide semiconductor film, a mixed solution of phosphoric acid, acetic acid, and nitric acid, or the like can be used. Alternatively, ITO-07N (produced by KANTO CHEMICAL CO., INC.) may be used. Further, the oxide semiconductor film may also be etched by dry etching using an inductively coupled plasma (ICP) etching method.

Further alternatively, oxygen (which includes at least one of an oxygen radical, an oxygen atom, and an oxygen ion) may be introduced into the oxide semiconductor film to supply oxygen to the oxide semiconductor film.

Oxygen is introduced to the oxide semiconductor film to supply the oxygen to the film, whereby oxygen vacancies in the oxide semiconductor film are compensated, which enables the oxide semiconductor film to be close to an intrinsic semiconductor. Accordingly, the threshold voltage of the transistor including the oxide semiconductor film can be shifted in the positive direction, so that the reliability of the transistor can be further improved.

As a method for introducing the oxygen, an ion implantation method, an ion doping method, plasma treatment, or the like can be used.

Next, the gate insulating film 108 is formed over the oxide semiconductor film 103. The gate insulating film 108 may be formed by a CVD method, a sputtering method, an MBE method, or a PLD method and is preferably formed by a sputtering method in particular.

Next, a resist mask 107 is formed over the gate insulating film 108. The resist mask 107 can be formed in such a manner that a resist is applied to the gate insulating film 108 and then light exposure and development are performed.

Then, a dopant is added to the oxide semiconductor film 103 using the resist mask 107 as a mask. The resistance of part of the oxide semiconductor film 103, to which the dopant is added, is reduced. By adding the dopant to the oxide semiconductor film 103 in the above manner, the oxide semiconductor film 106 which includes the source and drain regions 106b resistance of which is reduced by the addition of the dopant and the channel formation region 106a to which the dopant is not added is formed (see FIG. 5A).

The dopant is an impurity which reduces the resistance of an oxide semiconductor film. One or more of phosphorus (P), boron (B), nitrogen (N), and fluorine (F) can be used as the dopant.

As a method for adding the dopant, an ion implantation method, an ion doping method, or the like can be used. In addition, the substrate 100 may be heated during the addition is performed.

The addition of dopant may be performed plural times, and the number of kinds of dopant may be plural.

Further, heat treatment may be performed thereon after the dopant is added. As the preferable heating conditions, the heating temperature is higher than or equal to 300° C. and lower than or equal to 700° C., more preferably higher than or equal to 300° C. and lower than or equal to 450° C., the heating time is one hour, and the heating atmosphere is an oxygen atmosphere. The heat treatment may be performed in a nitrogen atmosphere, reduced pressure, or the air (ultra-dry air).

Next, the resist mask 107 is removed. Then, a conductive film is deposited over the gate insulating film and processed by etching to form the gate electrode 110 and the capacitor electrode 130 (see FIG. 5B).

Next, the second interlayer insulating film 112 is formed over the gate insulating film 108, the gate electrode 110, and the capacitor electrode 130. The second interlayer insulating film 112 may be formed by a CVD method, a sputtering method, an MBE method, a PLD method, or a spin coating method using a material which is similar to that of the base insulating film 104. Further, a contact hole is formed in the second interlayer insulating film 112 to expose part of one of the source and drain regions 106b, and then the second wiring 114 which is connected to the one of the source and drain regions 106b is formed (see FIG. 5C).

The transistor is a planar transistor in this embodiment but is not limited thereto. Any of a top-gate top-contact transistor, a top-gate bottom-contact transistor, a bottom-gate top-contact transistor, a bottom-gate bottom-contact transistor, and the like in each of which a source electrode and a drain electrode are formed in contact with an oxide semiconductor film may be used. Further, a top shape of the transistor is formed in square shape in this embodiment but may be formed in a circle shape or the like.

As described above, the dual-gate transistor Tr_1 in which the gate electrode 110 (also referred to as the front gate) and the first wiring 101 (also referred to as the back gate) overlap with the channel formation region 106a can be formed. Further, the front capacitor Cf_1, which is formed with the other of the source and drain regions 106b and the capacitor electrode 130, and the back capacitor Cb_1, which is formed with the other of the source and drain regions 106b and the third wiring 140, can be formed.

According to this embodiment, a front gate and a back gate are provided in a transistor in which a channel region is provided in an oxide semiconductor film, whereby the transistor having high on-state characteristics and low off-state current characteristics can be provided. The use of the transistor makes is possible to provide a semiconductor memory device which operates at high speed and consumes low power.

According to one embodiment of the present invention, a front capacitor and a back capacitor can be formed, whereby the capacitance of a capacitor in a semiconductor memory device can be increased.

A semiconductor memory device such as a DRAM can be formed using the transistor and the capacitor of one embodiment of the present invention. Further, a plurality of semiconductor memory devices are provided so as to overlap with each other to be stacked, whereby a semiconductor memory device whose storage capacity per unit area can be increased can be provided.

This embodiment can be implemented in appropriate combination with any of the other embodiments.

(Embodiment 2)

A semiconductor memory device which has a structure different from that of the semiconductor memory device of Embodiment 1 will be described in this embodiment with reference to FIGS. 6A to 6C. This embodiment is different from Embodiment 1 in that the semiconductor memory device includes a transistor including silicon in addition to a memory cell which is formed using a transistor including an oxide semiconductor.

The transistor including silicon has larger field-effect mobility than the transistor including an oxide semiconductor and thus is preferably used in a peripheral circuit of a memory cell or the like. In addition, the transistor including silicon is preferably provided below the memory cell which is formed with a stack of sub memory cells; however the transistor including silicon may be provided between sub memory cells which are stacked and the number of layers including the transistor may be one or more.

In this embodiment, the semiconductor memory device in which the transistor including silicon is formed in the lowest layer and the memory cell of Embodiment 1 is stacked thereover is described.

Figure 6A:
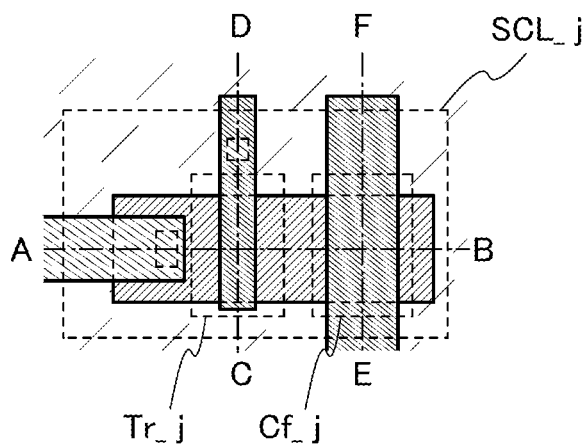
FIGS. 6A to 6C are a top view and cross-sectional views illustrating one example of a semiconductor memory device according to one embodiment of the present invention.
Figure 6C:
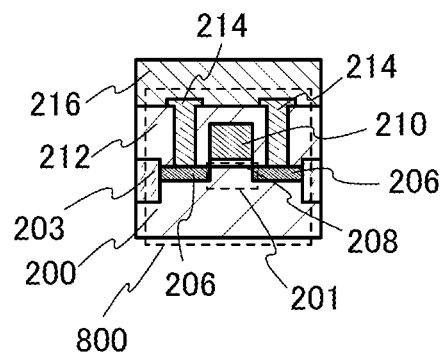
Figure 6B:
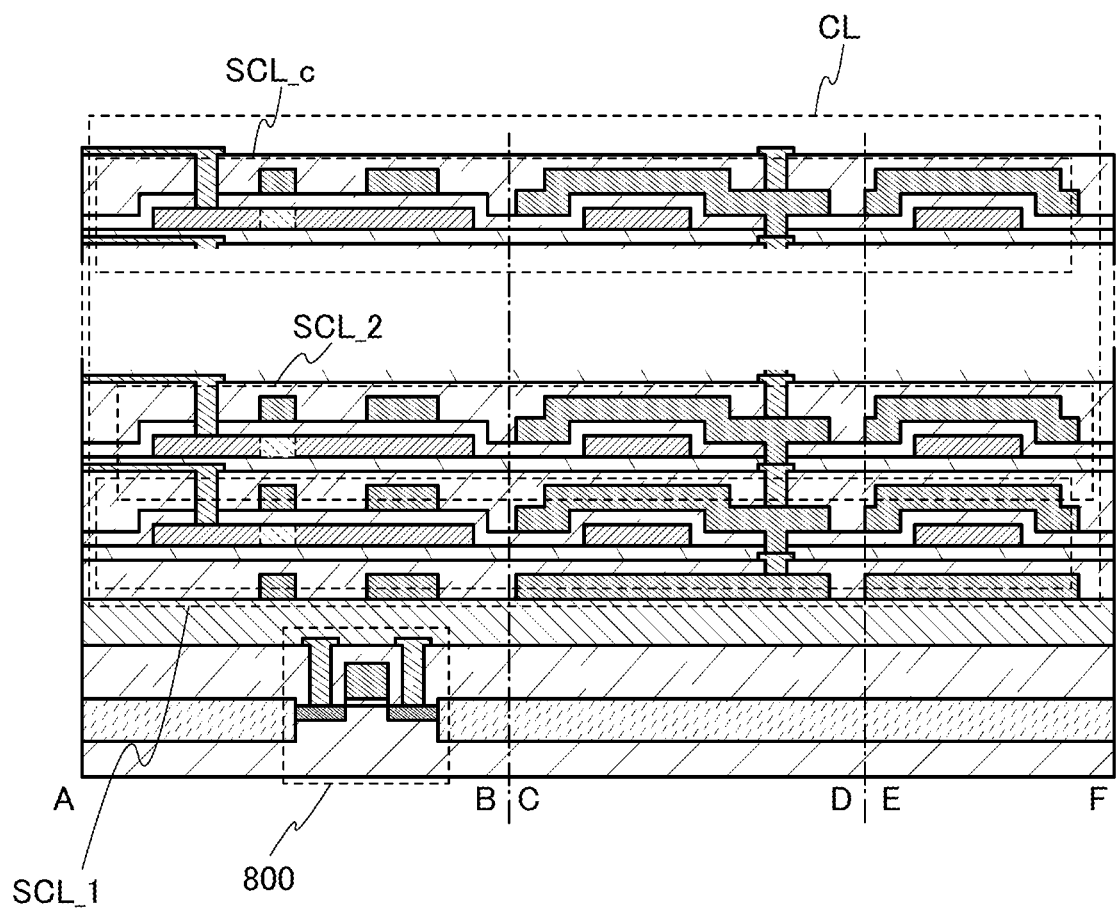

FIGS. 6A to 6C are a top view and cross-sectional views of the semiconductor memory device of this embodiment. FIG. 6A is a top view of the sub memory cell SCL_j and FIG. 6B is a cross-sectional view of the sub memory cells SCL_1 to SCL_c. As illustrated in FIG. 6B, a layer including a transistor 800 including silicon is formed below the memory cell CL in which sub memory cells are stacked to overlap with each other.

In the top view of FIG. 6A, the transistor Tr_j and the front capacitor Cf_j provided in the sub memory cell SCL_j are illustrated. Note that the back capacitor Cb_j is not illustrated to avoid complexity. Cross sections A-B, C-D, and E-F taken along dashed dotted lines A-B, C-D, and E-F, respectively, in the top view of the sub memory cell SCL_j in FIG. 6A are illustrated in FIG. 6B.

FIG. 6C is a cross-sectional view of the transistor 800 including silicon.

The transistor 800 includes a channel formation region 201 provided in a silicon substrate 200, impurity regions 206 which are provided so as to sandwitch the channel formation region 201, a gate insulating layer 208 which is provided over the channel formation region 201, a gate electrode 210 which is provided over the gate insulating layer 208, a first interlayer insulating film 212 over the gate electrode 210 and the impurity regions, source and drain electrodes 214 which are connected to the impurity regions 206 through contact holes provided in the first interlayer insulating film 212, and a second interlayer insulating film 216 over the first interlayer insulating film 212 and the source and drain electrodes 214.

An element isolation insulating layer 203 is formed on the silicon substrate 200 so as to surround the transistor 800.

A sidewall insulating film may be formed on the sidewall of the gate electrode 210 to form an LDD region. Note that it is preferable that the transistor 800 is not provided with a sidewall insulating layer as illustrated in FIG. 6C to achieve higher integration.

Next, components starting from the first wiring 101 and the third wiring 140 are sequentially formed, as described in Embodiment 1, over the second interlayer insulating film 216 of the transistor 800.

In the above manner, the transistor 800 including silicon can be formed and the dual-gate transistor Tr_j including an oxide semiconductor, which is described in Embodiment 1, can be formed to be stacked over the transistor 800. In addition, the front capacitor Cf_j, which is formed with the other of the source and drain regions 106b and the capacitor electrode 130, and the back capacitor Cb_j, which is formed with the other of the source and drain regions 106b and the third wiring 140, can be formed.

According to this embodiment, the transistor 800 including silicon and the transistor including the oxide semiconductor film can be formed. In addition, the transistor including the oxide semiconductor film is provided with the front gate and the back gate, whereby the transistor can have high on-state characteristics and low off-state current characteristics. The use of the transistor makes it possible to provide a semiconductor memory device which operates at high speed and consumes low power.

According to one embodiment of the present invention, the semiconductor memory device in which the front capacitor and the back capacitor are provided in each sub memory cell can be formed. When the two capacitors are provided in such a manner, the total capacitance of all the capacitors in the semiconductor memory device can be increased.

A semiconductor memory device such as a DRAM can be formed using the transistor and the capacitor of one embodiment of the present invention. In addition, the plurality of semiconductor memory devices are provided so as to overlap with each other to be stacked, whereby a semiconductor memory device whose storage capacity per unit area can be increased can be provided.

Further, since the transistor including silicon has larger field-effect mobility than the transistor including an oxide semiconductor, the transistor including silicon can be used in a peripheral circuit or the like of a memory cell, so that the memory cell and the peripheral circuit can be formed over the same substrate.

This embodiment can be implemented in appropriate combination with any of the other embodiments.

(Embodiment 3)

A central processing unit (CPU) can be formed using the semiconductor memory device described in Embodiment 1 or Embodiment 2 for at least part of the CPU.

Figure 7A:
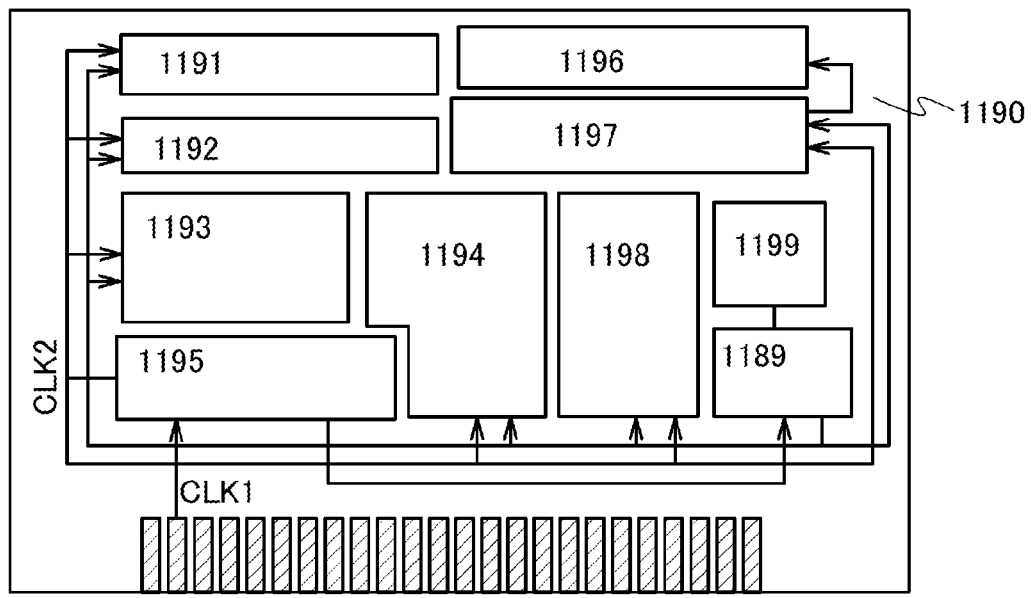
FIG. 7A is a block diagram illustrating a specific example of a CPU including a semiconductor memory device according to one embodiment of the present invention and FIGS. 7B and 7C are each a partial circuit diagram thereof.

FIG. 7A is a block diagram illustrating a specific structure of a CPU. The CPU illustrated in FIG. 7A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 7A is only an example in which the structure is simplified, and an actual CPU has various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 7A, a memory element is provided in the register 1196. As the memory element in the register 1196, for example, the semiconductor memory device described in Embodiment 1 or Embodiment 2 can be used.

In the CPU illustrated in FIG. 7A, the register controller 1197 selects operation of holding data in the register 1196 in accordance with an instruction from the ALU 1191. That is, the register controller 1197 selects whether data is held by a logic element which inverts a logic (logic level) or a capacitor in the memory element included in the register 1196. When data is held by the logic element which inverts a logic (logic level), a power supply voltage is supplied to the memory element in the register 1196. When data is held by the capacitor, the data in the capacitor is rewritten, and supply of the power supply voltage to the memory element in the register 1196 can be stopped.

Figure 7B:
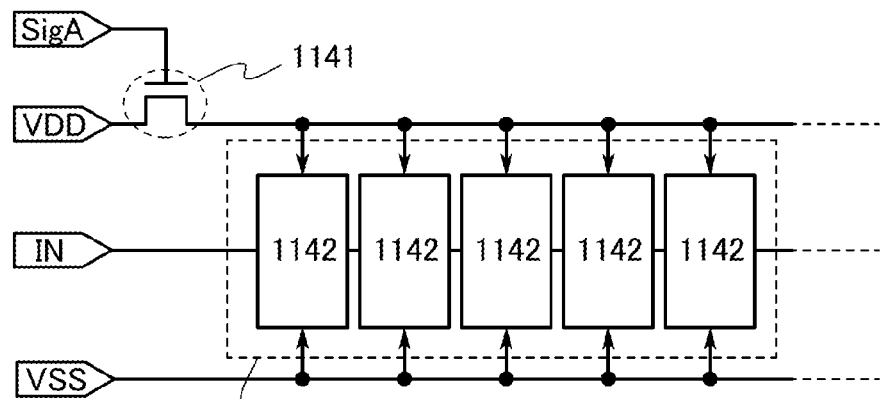
Figure 7C:
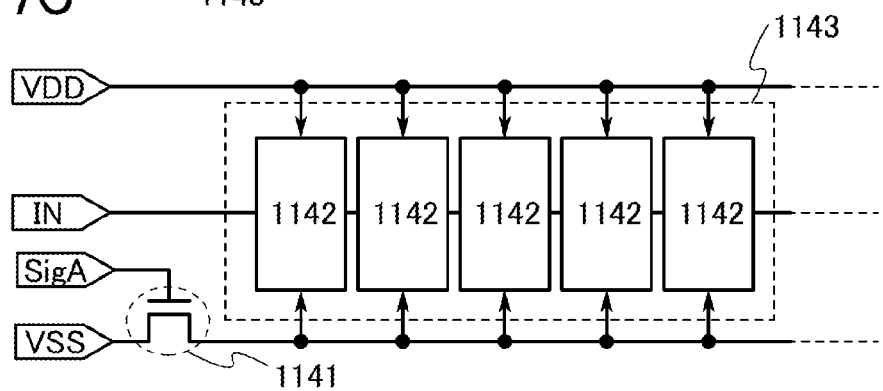

The power supply can be stopped by providing a switching element between a memory element group and a node to which a power supply potential VDD or a power supply potential VSS is supplied, as illustrated in FIG. 7B or FIG. 7C. Circuits illustrated in FIGS. 7B and 7C are described below.

FIGS. 7B and 7C each illustrate an example of a structure including any of the transistors described in Embodiment 1 and Embodiment 2 as a switching element for controlling supply of a power supply potential to a memory element.

The memory device illustrated in FIG. 7B includes a switching element 1141 and a memory element group 1143 including a plurality of memory elements 1142. Specifically, as each of the memory elements 1142, the memory element described in Embodiment 1 or Embodiment 2 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 7B, a transistor whose active layer includes a semiconductor with a wide band gap, such as an oxide semiconductor, is used as the switching element 1141, and the switching of the transistor is controlled by a signal SigA supplied to a gate thereof.

Note that FIG. 7B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 7C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the other embodiments.

(Embodiment 4)

In this embodiment, examples of an electronic appliance including at least one of the semiconductor memory devices described in Embodiment 1 or 2 and the CPU described in Embodiment 3 will be described.

Figure 8A:
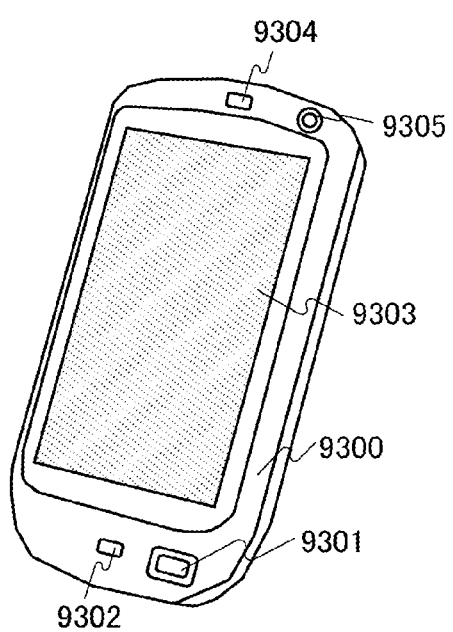
FIGS. 8A to 8D are perspective views illustrating examples of an electronic appliance including a semiconductor memory device according to one embodiment of the present invention.

FIG. 8A illustrates a portable information terminal. The portable information terminal illustrated in FIG. 8A includes a housing 9300, a button 9301, a microphone 9302, a display portion 9303, a speaker 9304, and a camera 9305, and has a function as a mobile phone.

Figure 8B:
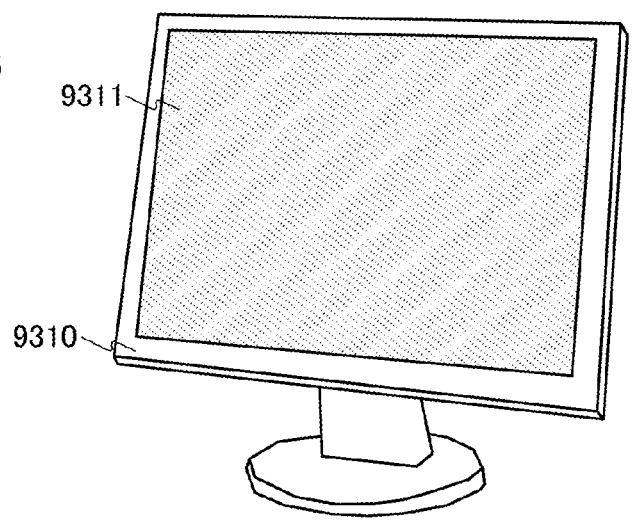

FIG. 8B illustrates a display. The display illustrated in FIG. 8B includes a housing 9310 and a display portion 9311.

Figure 8C:
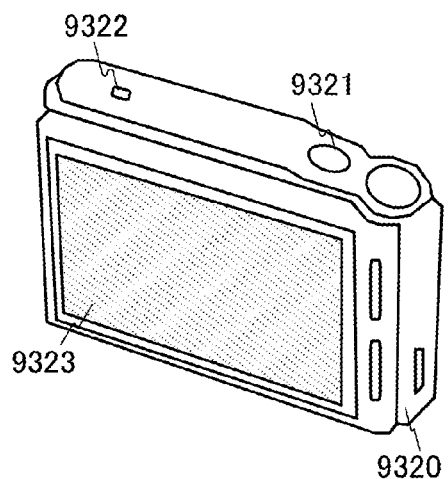

FIG. 8C illustrates a digital still camera. The digital still camera illustrated in FIG. 8C includes a housing 9320, a button 9321, a microphone 9322, and a display portion 9323.

Figure 8D:
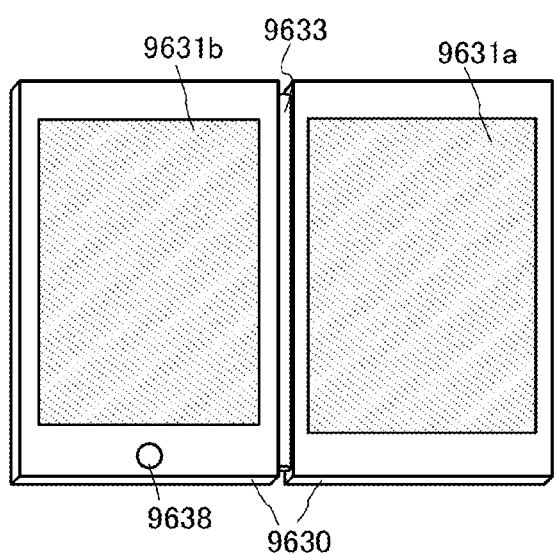

FIG. 8D illustrates a double-foldable portable information terminal. The double-foldable portable information terminal illustrated in FIG. 8D includes a housing 9630, a display portion 9631*a*, a display portion 9631*b*, a hinge 9633, and an operation switch 9638.

Part or whole of the display portion 9631*a* and/or the display portion 9631*b* can function as a touch panel. By touching an operation key displayed on the touch panel, a user can input data, for example.

By applying one embodiment of the present invention, the performance of the electronic appliances can be improved.

This embodiment can be implemented in appropriate combination with any of the other embodiments.

This application is based on Japanese Patent Application serial no. 2011-281599 filed with Japan Patent Office on Dec. 22, 2011, the entire contents of which are hereby incorporated by reference.

What is claimed is:

1. A semiconductor memory device comprising a memory cell including two or more sub memory
    cells, the sub memory cells each including:
    a word line;
    a bit line;
    a first capacitor;
    a second capacitor; and
    a transistor,
    wherein the sub memory cells are stacked in the memory cell,
    wherein the transistor comprises a first gate, a second gate and a semiconductor film between the first gate and the second gate,
    wherein the first gate and the second gate are electrically connected to the word line,
    wherein one of a source and a drain of the transistor is electrically connected to the bit line,
    wherein the other of the source and the drain of the transistor is electrically connected to the first capacitor and the second capacitor, and
    wherein the first gate and the second gate of the transistor overlap with each other and are electrically connected to each other.

2. The semiconductor memory device according to claim 1, wherein the first capacitor and the second capacitor overlap with each other.

3. The semiconductor memory device according to claim 1, wherein the semiconductor memory device includes a plurality of memory cells formed in matrix in a plane.

4. The semiconductor memory device according to claim 1, wherein the semiconductor film includes an oxide semiconductor.

5. The semiconductor memory device according to claim 1, wherein the semiconductor memory device further comprises a transistor including a channel formation region in a silicon substrate and overlapping with the sub memory cells.

6. The semiconductor memory device according to claim 1, wherein each of the sub memory cells is a DRAM.

7. The semiconductor memory device according to claim 1, wherein one terminal of the first capacitor is grounded.

8. The semiconductor memory device according to claim 1, wherein both of the first capacitor and the second capacitor include a semiconductor film.

9. A semiconductor memory device comprising a memory cell including a plurality of sub memory cells, the plurality of sub memory cells each including:
    a first capacitor;
    a second capacitor; and
    a transistor,
    wherein the plurality of sub memory cells are stacked in the memory cell,
    wherein the transistor is provided with a first gate and a second gate with a semiconductor film provided therebetween,
    wherein the first gate and the second gate are overlap with each other and are electrically connected to each other, and
    wherein one of a source and a drain of the transistor is electrically connected to the first
    capacitor and the second capacitor.

10. The semiconductor memory device according to claim 9, wherein the first capacitor and the second capacitor overlap with each other.

11. The semiconductor memory device according to claim 9, wherein the semiconductor memory device includes a plurality of the memory cells formed in matrix in a plane.

12. The semiconductor memory device according to claim 9, wherein the semiconductor film includes an oxide semiconductor.

13. The semiconductor memory device according to claim 9, wherein the semiconductor memory device further comprises a transistor including a channel formation region in a silicon substrate and overlapping with the plurality of sub memory cells.

14. The semiconductor memory device according to claim 9, wherein each of the plurality of sub memory cells is a DRAM.

15. The semiconductor memory device according to claim 9, wherein one terminal of the first capacitor is grounded.

16. The semiconductor memory device according to claim 9, wherein both of the first capacitor and the second capacitor include a semiconductor film.

* * * * *